(12) United States Patent
Matsumoto

(10) Patent No.: US 9,911,796 B2
(45) Date of Patent: Mar. 6, 2018

(54) DISPLAY DEVICE AND METHOD OF MANUFACTURING A DISPLAY DEVICE

(71) Applicant: Japan Display Inc., Minato-ku (JP)

(72) Inventor: Yukio Matsumoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/335,062

(22) Filed: Oct. 26, 2016

(65) Prior Publication Data
US 2017/0186825 A1 Jun. 29, 2017

(30) Foreign Application Priority Data

Dec. 25, 2015 (JP) ................................. 2015-255388

(51) Int. Cl.
*H01L 27/32* (2006.01)
*H01L 51/52* (2006.01)
*H01L 51/56* (2006.01)

(52) U.S. Cl.
CPC ........ *H01L 27/3246* (2013.01); *H01L 27/322* (2013.01); *H01L 27/3272* (2013.01); *H01L 51/5225* (2013.01); *H01L 51/56* (2013.01); *H01L 2227/323* (2013.01)

(58) Field of Classification Search
CPC ............. H01L 27/3246; H01L 27/3272; H01L 51/5225; H01L 51/56; H01L 27/322; H01L 2227/323; H01L 27/3258
See application file for complete search history.

(56) References Cited

U.S. PATENT DOCUMENTS

| 9,478,591 | B2 * | 10/2016 | Nam | .................... | H01L 27/3246 |
| 2005/0082966 | A1 * | 4/2005 | Yamazaki | ........... | H01L 27/3244 |
| | | | | | 313/498 |
| 2017/0125506 | A1 * | 5/2017 | Kim | .................... | H01L 27/3276 |

FOREIGN PATENT DOCUMENTS

| JP | 2001-85167 | 3/2001 |
| JP | 2014-179163 | 9/2014 |

* cited by examiner

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

A display device, which includes a plurality of unit pixels, includes a plurality of first electrodes respectively corresponding to the plurality of unit pixels, an insulating layer which includes a plurality of through holes, a light emitting element layer, and a second electrode. Each of the plurality of through holes have inner surfaces including a forwardly tapered surface, which is inclined in a direction of enlarging the apertures toward a light emitting direction, and a reversely tapered surface, which is inclined in a direction of reducing the apertures toward the light emitting direction. The forwardly tapered surface is formed between the unit pixels arranged side by side in the first direction. The reversely tapered surface is formed between the unit pixels arranged side by side in the second direction.

9 Claims, 14 Drawing Sheets

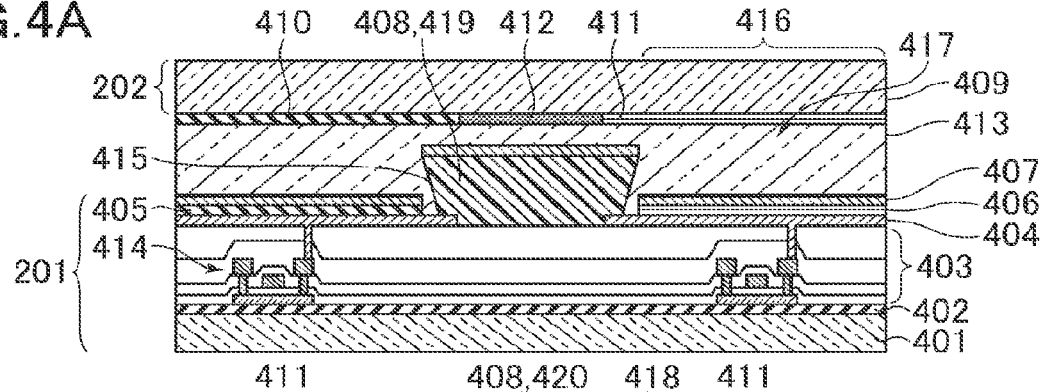
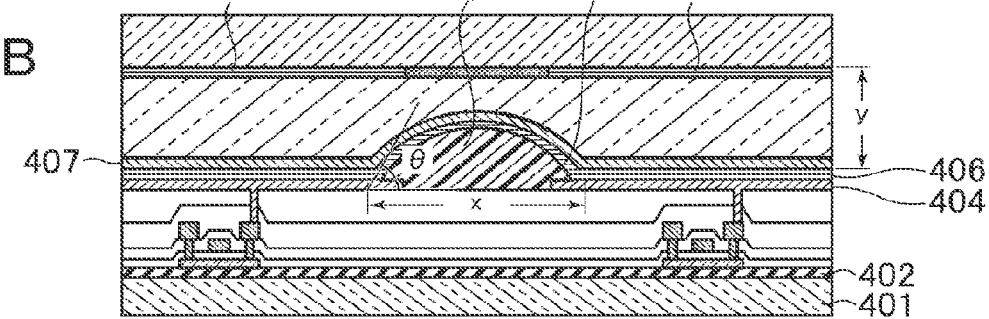
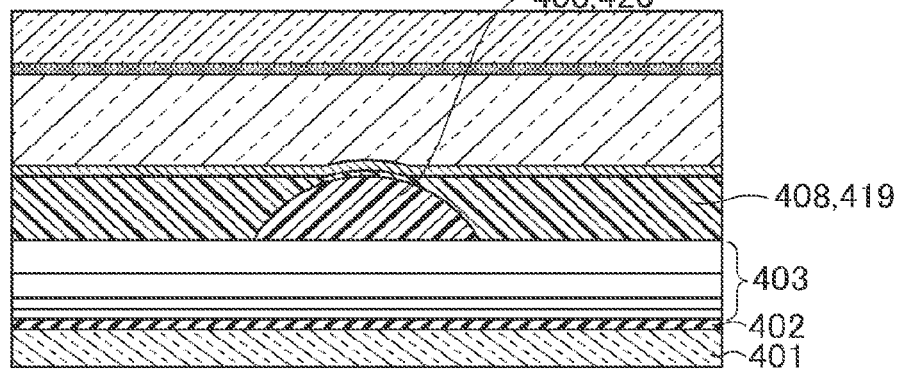
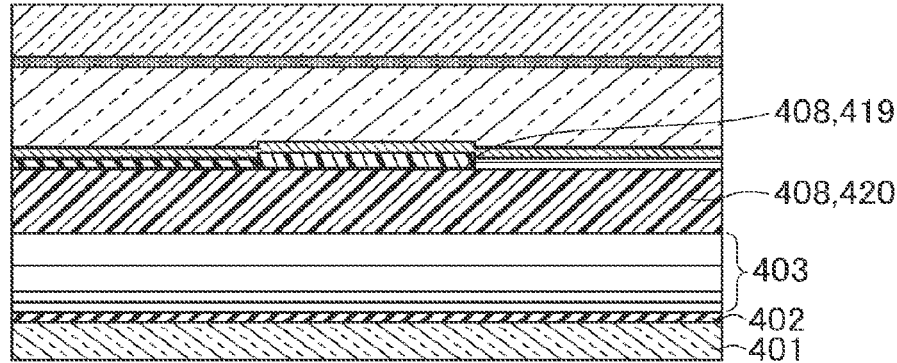

DISPLAY DEVICE AND METHOD OF MANUFACTURING A DISPLAY DEVICE

CROSS-REFERENCE TO RELATED APPLICATION

The present application claims priority from the Japanese Application JP 2015-255388 filed on Dec. 25, 2015, the content of which is hereby incorporated by reference into this application.

BACKGROUND OF THE INVENTION

1. Field of the Invention

The present invention relates to a display device and a method of manufacturing a display device.

2. Description of the Related Art

In recent years, needs for slim display devices have been increased along with informatization development. Slim display devices such as liquid crystal display devices, plasma displays, and organic electro-luminescent (EL) display devices have been put into practical uses. In addition, research and development for increasing resolution and display quality and for reducing manufacturing cost of each type of slim display devices has been actively conducted.

According to Japanese Patent Application Laid-open No. 2014-179163, for example, there is disclosed the structure in which a two-layer partition wall, which has a reversely tapered shape on a lower layer side and a forwardly tapered shape on an upper layer side, is formed to partition a part of a cathode electrode by the partition wall on the lower layer side. It is disclosed that, with this structure, moisture contained in an organic layer can be released, and degradation of elements, such as a reduction in brightness due to moisture, is reduced.

Moreover, according to Japanese Patent Application Laid-open No. 2001-85167 to be described below, for example, there is disclosed the structure in which a sectional shape of a partition wall is a parallelogram shape, and in which an acute edge portion is formed at one side edge of an upper end surface so that a cathode material to be formed into a film thereon by vapor deposition or the like is partitioned at the acute edge portion. It is disclosed that, with this structure, a plurality of electrically isolated cathodes can be formed without using a mask or the like, and a load in manufacturing steps is reduced.

SUMMARY OF THE INVENTION

FIG. 14 is a view for illustrating color mixing of light from adjacent pixels in a related-art organic electro-luminescent (EL) display device. As illustrated in FIG. 14, on an upper layer side of an inorganic insulating layer 402, which is formed on a lower glass substrate 401, and a thin film transistor (TFT) layer 403, which is formed to include pixel transistors 414, pixel electrodes 404, self-light-emitting element layers 405 and 406, and an insulating layer 408 are formed, and a common electrode 407 is formed to cover the self-light-emitting element layers 405 and 406 and the insulating layer 408.

Then, when the insulating layer 408 is formed to include a reversely tapered shape, the common electrode 407 is partitioned by a step of the insulating layer 408. In such case, a resistance value of the common electrode becomes higher, and a voltage drops. In order to prevent the partition of the common electrode 407, the insulating layer 408 is generally formed to have a forwardly tapered shape. However, light emitted from adjacent pixels travels along a forwardly tapered wall surface while spreading toward an upper glass substrate 409, which is arranged via the sealing layer 413 as illustrated in FIG. 14, and hence there occurs a phenomenon in which colors of light emitted from the adjacent pixels are mixed on the upper glass substrate 409.

Specifically, light emitted from the self-light-emitting element layers 404 and 405 travels while spreading along forwardly tapered surfaces in a direction of adjacent pixels. Therefore, unless a width of the insulating layer 408 is secured depending on a distance from the self-light-emitting element layers 404 and 405 to lower surfaces of color filter layers 410, 411, and 1401, and on an interior angle of a forwardly tapered surface of the insulating layer 408, light emitted from adjacent unit pixels cannot be prevented from being mixed. As a result, there arises a need for measures including securing the width of the insulating layer 408, providing a wide light shielding layer 412, and the like, and high resolution is hindered from being achieved, for example.

As in Japanese Patent Application Laid-open No. 2014-179163 described above, for example, even when the partition wall has the two-layer structure, and is formed to have the reversely tapered shape on the lower layer side, when the partition wall is formed to have the forwardly tapered shape on the upper layer side, there is a possibility that the above-mentioned color mixing may occur. Further, as in Japanese Patent Application Laid-open No. 2001-85167 described above, even when the partition wall is formed to have the parallelogram shape, one side surface of the partition wall has a reversely tapered shape, but the other side surface has a forwardly tapered shape. As a result, there is a possibility that the above-mentioned color mixing may occur.

The present invention has been made in view of the above-mentioned problems, and therefore has an object to provide a display device, which prevents color mixing of light emitted from adjacent pixels while preventing a voltage drop from occurring due to partition of a common electrode.

According to one aspect of the present invention, a display device, which includes a plurality of unit pixels of a plurality of colors, and is configured to display a color image, includes a plurality of first electrodes respectively corresponding to the plurality of unit pixels, an insulating layer, which includes a plurality of through holes respectively overlapping the plurality of first electrodes, and is configured to cover peripheral portions of each of the plurality of first electrodes, a light emitting element layer, which is laminated on the insulating layer, and is connected to the plurality of first electrodes via the plurality of through holes, and a second electrode, which is laminated on the insulating layer and the light emitting element layer. The plurality of unit pixels is arranged so that the unit pixels of the same color are arranged in a first direction and the unit pixels of different colors are arranged side by side in a second direction, which crosses the first direction. The insulating layer includes apertures of the plurality of through holes in a surface that is opposite to the light emitting element layer. Each of the plurality of through holes have inner surfaces including a forwardly tapered surface, which is inclined in a direction of enlarging the apertures toward a light emitting direction, and a reversely tapered surface, which is inclined in a direction of reducing the apertures toward the light emitting direction. The forwardly tapered surface is formed between the unit pixels arranged side by side in the first direction. The reversely tapered surface is formed between the unit pixels arranged side by side in the second direction.

In one embodiment of the present invention, the display device further includes a color filter layer including a plurality of colored regions of a plurality of colors respectively corresponding to the plurality of unit pixels.

In one embodiment of the present invention, the light emitting element layer is configured to emit light of a single color toward the plurality of colored regions.

In one embodiment of the present invention, the insulating layer is configured to have a light shielding property.

In one embodiment of the present invention, the insulating layer has a grating shape including a plurality of first rib portions, each of the plurality of first rib portions extending in the second direction, and being arranged at intervals from each other in the first direction, and a plurality of second rib portions, each of the plurality of second rib portions extending in the first direction to connect the intervals between the first rib portions arranged side by side, and being arranged at intervals from each other in the second direction. The forwardly tapered surface includes at least a part of a first side surface facing the first direction of each of the plurality of first rib portions. The reversely tapered surface includes at least a part of a second side surface facing the second direction of each of the plurality of second rib portions.

In one embodiment of the present invention, the plurality of second rib portions have an upper surface that is formed higher than an upper surface of the plurality of first rib portions in sectional view, and have a difference in height between the plurality of first rib portions and the plurality of second rib portions of equal to or less than a thickness of the second electrode.

In one embodiment of the present invention, the plurality of second rib portions and the plurality of first rib portions are connected without a step to be flush with each other.

In one embodiment of the present invention, the plurality of second rib portions have an upper surface that is formed lower than an upper surface of the plurality of first rib portions in sectional view.

In one embodiment of the present invention, the display device further includes a sealing layer, which is configured to cover the plurality of first electrodes, the insulating layer, the light emitting element layer, and the second electrode. An interface between the sealing layer and a layer immediately below the sealing layer has a shape corresponding to the reversely tapered surface above the plurality of first rib portions.

According to another aspect of the present invention, there is provided a method of manufacturing a display device, which includes a plurality of unit pixels of a plurality of colors, and is configured to display a color image. The method including the steps of: forming an insulating layer, which has a grating shape including a plurality of through holes respectively overlapping a plurality of first electrodes respectively corresponding to the plurality of unit pixels, and is configured to cover peripheral portions of each of the plurality of first electrodes; forming a light emitting element layer, which is laminated on the insulating layer, and is connected to the plurality of first electrodes via the plurality of through holes; and forming a second electrode, which is laminated on the insulating layer and the light emitting element layer. The plurality of unit pixels is arranged so that the unit pixels of the same color are arranged in a first direction and the unit pixels of different colors are arranged side by side in a second direction, which crosses the first direction. The insulating layer includes apertures of the plurality of through holes in a surface that is opposite to the light emitting element layer. Each of the plurality of through holes have inner surfaces including a forwardly tapered surface, which is inclined in a direction of enlarging the apertures, and a reversely tapered surface, which is inclined in a direction of reducing the apertures. The forming an insulating layer including the steps of: forming a first photosensitive resin layer of a negative type, which has solubility that is reduced in developer by exposure to light; patterning the first photosensitive resin layer to form a plurality of first rib portions, each of the plurality of first rib portions extending in the second direction, and being arranged side by side in the first direction among the unit pixels, to have the forwardly tapered surface in at least a part of a first side surface facing the first direction; forming, after patterning the first photosensitive resin layer, a second photosensitive resin layer of a positive type, which has solubility that is increased in developer by exposure to light; and patterning the second photosensitive resin layer to form a plurality of second rib portions, each of the plurality of second rib portions extending in the first direction to connect intervals between the first rib portions that are arranged side by side, and being arranged among the unit pixels that are arranged side by side in the second direction, to have the reversely tapered surface in at least a part of a second side surface facing the second direction.

BRIEF DESCRIPTION OF THE DRAWINGS

FIG. 4A, FIG. 4B, FIG. 4C, and FIG. 4D are sectional views corresponding to cross sections taken along the lines IVa-IVa to IVd-IVd in FIG. 3B, respectively.

DETAILED DESCRIPTION OF THE INVENTION

Figure 1:
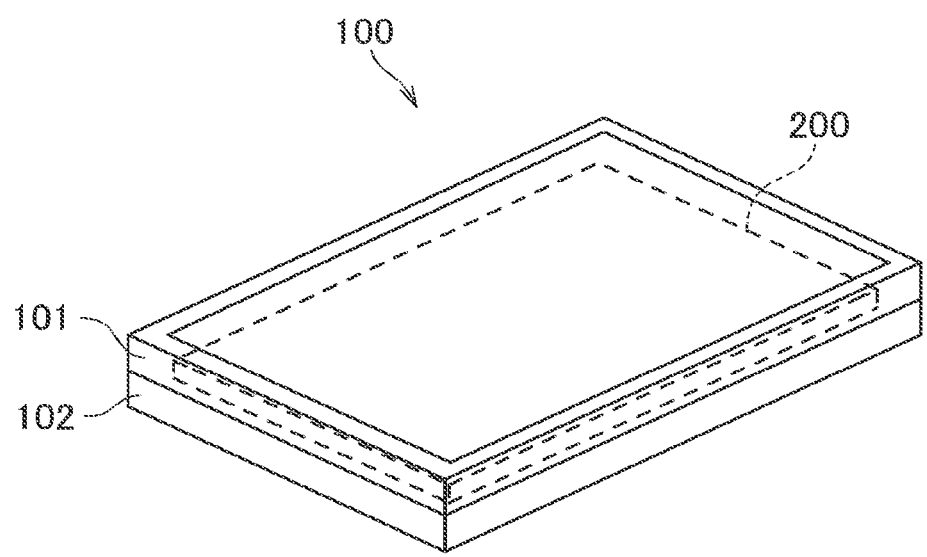
FIG. 1 is a view for schematically illustrating a display device according to an embodiment of the present invention.

Embodiments of the present invention are described below with reference to the attached drawings. The disclosure is only exemplary, and modifications made as appropriate within the gist of the present invention that can be conceived with ease by those skilled in the art are naturally within the scope of the present invention. For clearer illustration, some widths, thicknesses, shapes, and the like of respective portions are schematically illustrated in the drawings in comparison to actual ones. However, the widths, the thicknesses, the shapes, and the like are merely an example, and do not limit understanding of the present invention. Further, like elements as those described relating to the drawings already referred to be denoted by like reference symbols herein and in each of the drawings, and detailed description thereof is sometimes omitted as appropriate.

FIG. 1 is a view for schematically illustrating a display device 100 according to an embodiment of the present invention. As illustrated in FIG. 1, the display device 100 includes an organic EL panel 200 sandwiched and fixed between an upper frame 101 and a lower frame 102.

Figure 2:
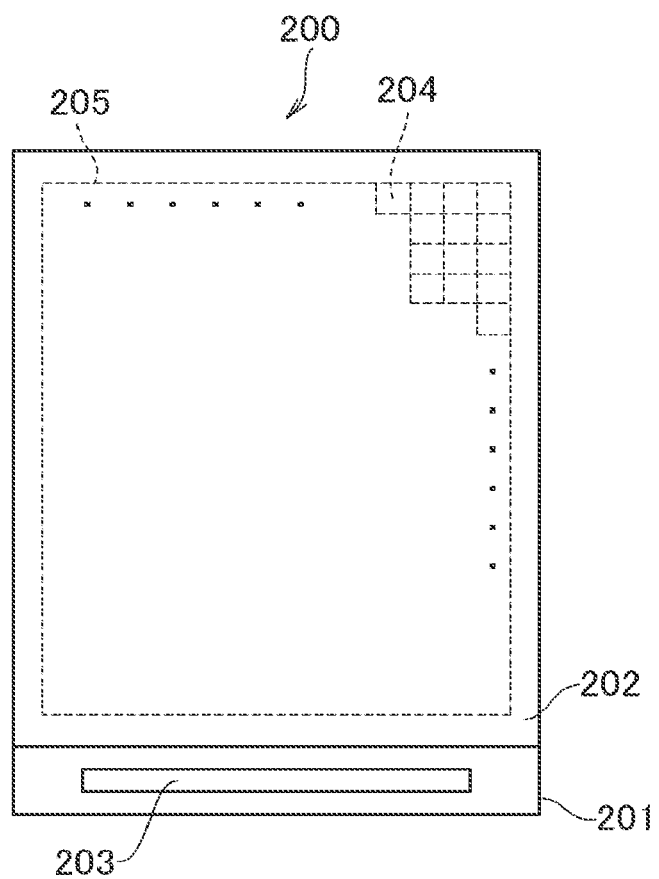
FIG. 2 is a view for illustrating the structure of an organic electro-luminescent (EL) panel when viewed from a display side.

FIG. 2 is a schematic view for illustrating the configuration of the organic EL panel 200 of FIG. 1. As illustrated in FIG. 2, the organic EL panel 200 includes an array substrate 201, an opposing substrate 202, and a driver integrated circuit (IC) 203. The array substrate 201 has formed therein self-light emitting element layers or the like described later, and is bonded to the opposing substrate 202 with a sealing layer 413 (see FIG. 4A to FIG. 4D). The driver IC 203 is configured to, for example, apply a potential to scanning signal lines of pixel transistors 414 (see FIG. 4A), which are arranged for unit pixels 204 respectively corresponding to a plurality of subpixels forming one pixel for full color display, thereby electrically connecting a source and a drain of each of the pixel transistors 414, and to cause current corresponding to grayscale values of the unit pixels 204 to flow to data signal lines of the respective pixel transistors 414. The organic EL panel 200 is configured to display a color image formed of the plurality of unit pixels 204 of a plurality of colors on a display region 205 with the driver IC 203.

Figure 3A:
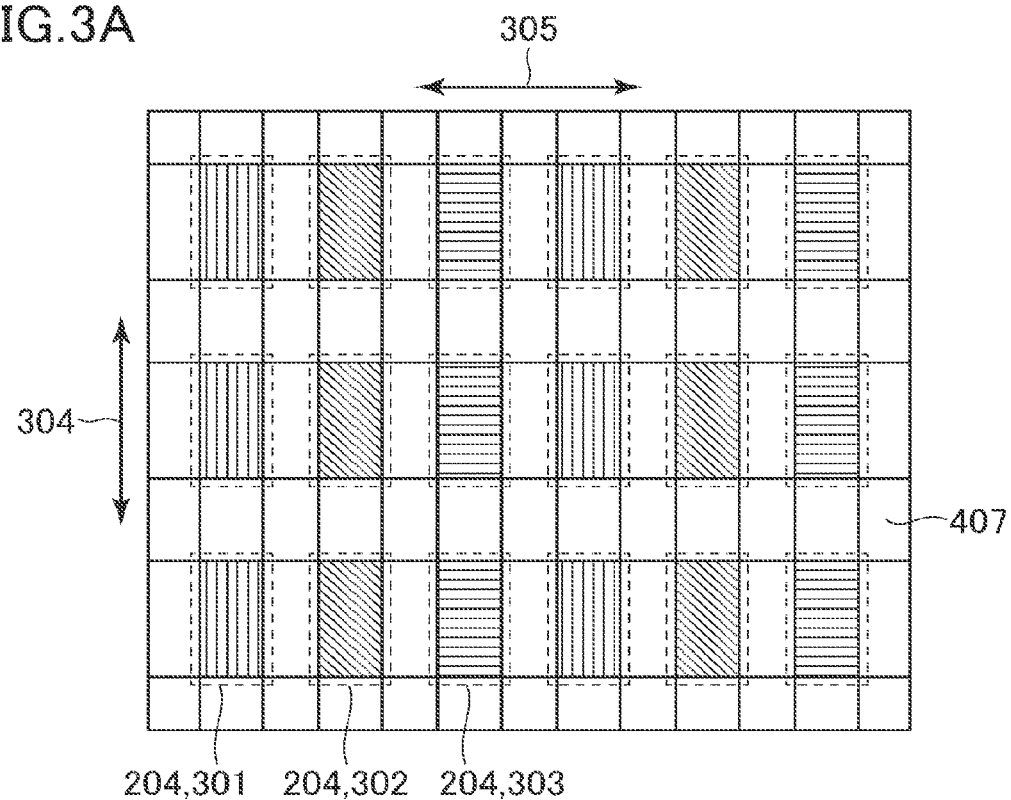
FIG. 3A and FIG. 3B are an enlarged plan view and an enlarged perspective view of a peripheral portion of unit pixels, respectively.

Next, description is made of the structure of the organic EL panel 200 in plan view. FIG. 3A is an enlarged view of the periphery of the unit pixels 204 in FIG. 2. As illustrated in FIG. 3A, a plurality of unit pixels 204 are arranged so that unit pixels 204 of the same color are arranged in an up-and-down direction (hereinafter referred to as a "first direction 304") in the figure, and so that unit pixels 204 of different colors are arranged side by side in a left-and-right direction (hereinafter referred to as a "second direction 305"), which crosses the first direction 304, in the figure. Specifically, red, green, or blue unit pixels 301, 302, or 303 are arranged side by side in the first direction 304. Moreover, the red, green, and blue unit pixels 301, 302, and 303 are arranged in the stated order in the second direction 305.

Figure 3B:
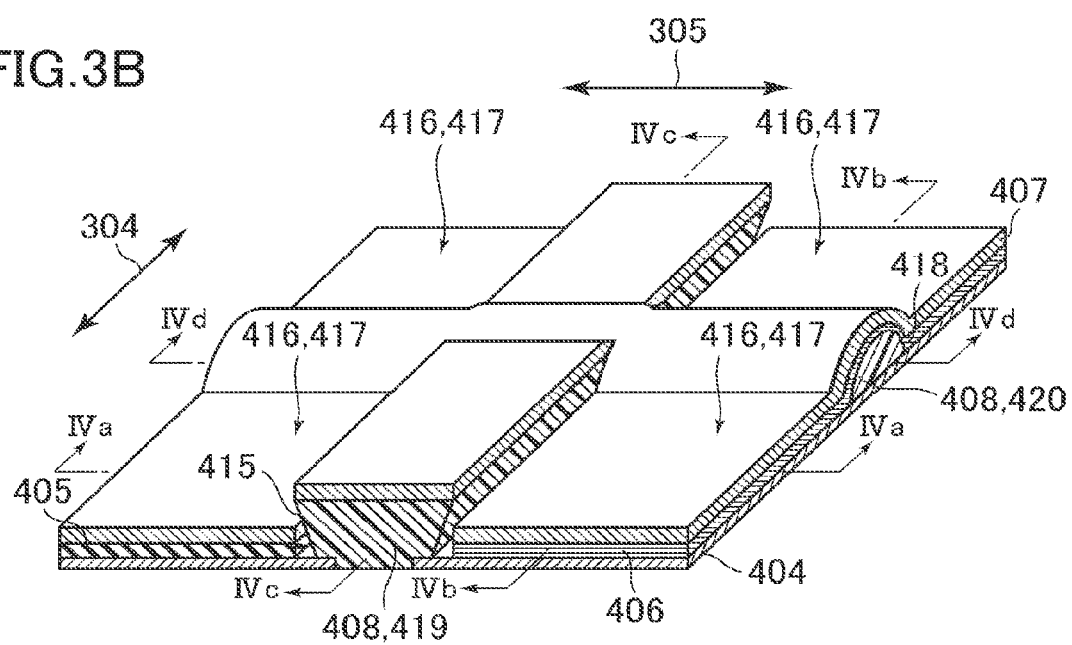

Next, description is made of the structure of the organic EL panel 200 in sectional view. FIG. 3B is a perspective view around four unit pixels 204 including two green unit pixels 302 and two blue unit pixels 303 in FIG. 3A. Moreover, FIG. 4A to FIG. 4D are sectional views of portions corresponding to four cross sections taken along the lines IVa-IVa to IVd-IVd illustrated in FIG. 3B, respectively. FIG. 3B is a view for schematically illustrating the organic EL panel 200, and parts of a thin film transistor (TFT) circuit layer, the sealing layer 413, and the like in FIG. 4A to FIG. 4D are omitted. The organic EL panel 200 according to the present invention adopts a top emission type. In FIG. 4A to FIG. 4D, a direction of light emitted upward is defined as a "light emitting direction".

FIG. 4A is a sectional view corresponding to a cross section taken along the line IVa-IVa in FIG. 3B. As illustrated in FIG. 4A, the array substrate 201 includes a lower glass substrate 401, one or a plurality of inorganic insulating layers 402, and a TFT circuit layer 403, pixel electrodes 404, a green self-light-emitting element layer 405 and a blue self-light-emitting element layer 406, a common electrode 407, and an insulating layer 408, which are formed in the stated order above the inorganic insulating layer 402 toward the opposing substrate 202. The organic EL panel 200 also includes, in addition to the array substrate 201, the opposing substrate 202, which includes an upper glass substrate 409, and color filter layers 410 and 411 and a light shielding layer 412, which are formed below the upper glass substrate 409, and a sealing layer 413 configured to seal a space between the array substrate 201 and the opposing substrate 202.

A material of the lower glass substrate 401 and the upper glass substrate 409 is not limited to a glass substrate, and may be a polyimide substrate having flexibility, for example. In the case of a substrate having flexibility, conditions against color mixing becomes stricter, and hence the structure according to the present invention is optimal. The inorganic insulating layer 402 is made of a silicon oxide film, a silicon nitride film, or the like, and may be formed of a plurality of layers.

The TFT circuit layer 403 includes pixel transistors 414, each of the pixel transistors 414 including source wiring, drain wiring, gate wiring, and a semiconductor layer. One of the source wiring or the drain wiring of the pixel transistor 414 is connected to the pixel electrode 404. The detailed structure of the pixel transistor 414 is similar to that in the related art, and hence description thereof is omitted.

The pixel electrodes 404 are formed to correspond to the plurality of unit pixels 204 (FIG. 3A), respectively. Specifically, each pixel electrode 404 is formed on an upper layer side of the TFT circuit layer 403 to be electrically connected to the pixel transistor 414, which is formed to correspond to each unit pixel 204.

The self-light-emitting element layers 405 and 406 are laminated on the insulating layer 408 including a plurality of through holes 416 to be connected to the plurality of pixel electrodes 404 via the plurality of through holes 416. Specifically, as illustrated in FIG. 4A, the self-light-emitting element layers 405 and 406 are formed on both the left and right sides of the insulating layer 408, on which reversely tapered surfaces 415 are formed, and on the pixel electrodes 404.

Here, above the self-light-emitting element layers 405 and 406, the color filter layers 410 and 411 are formed in the opposing substrate 202. The color filter layers 410 and 411 have colored regions of a plurality of colors. Specifically, for example, the color filter layers 410 and 411 include, among the light shielding layer 412 formed on the upper glass substrate 409, a red color filter layer configured to selectively transmit red light, a green color filter layer 410 configured to selectively transmit green light, and a blue color filter layer 411 configured to selectively transmit blue light.

Specifically, the green self-light-emitting element layer 405 is formed in the green unit pixel 302 (FIG. 3A), and the blue self-light-emitting element layer 406 is formed in the blue unit pixel 303 (FIG. 3A). Although not shown in FIG. 4A, a red self-light-emitting element layer is further formed in the red unit pixel 301. The self-light-emitting element layers 405 and 406 are configured to emit light with current flowing from the pixel electrodes 404 to the common electrode 407. Moreover, the self-light-emitting element layers 405 and 406 are laminated avoiding the insulating layer 408 (second rib portion 419) in the cross section taken along the line IVa-IVa, but are laminated on the upper side of the insulating layer 408 (first rib portion 420) in the cross section taken along the line IVb-IVb, which is to be described later.

In FIG. 4A to FIG. 4D, the self-light-emitting element layers include the self-light-emitting element layers 405 and 406, which are configured to emit light of a plurality of colors, but may be formed only of a self-light-emitting element layer that is configured to emit white light (see FIG. 13A to FIG. 13D). With this structure, as compared to an embodiment in which the self-light-emitting element layers are formed only of the self-light-emitting element layer that is configured to emit white light, a National Television System Committee (NTSC) ratio is increased, and optical characteristics may be improved.

Moreover, each of the self-light-emitting element layers 405 and 406 is formed by laminating, on the upper layer side of the pixel electrode 404, a hole injection layer, a hole transport layer, a light emitting layer, an electron transport layer, and an electron injection layer in the stated order. Here, the light emitting layer is formed of an organic EL material, and is formed of materials corresponding to the above-mentioned red self-light-emitting element layer, green self-light-emitting element layer 405, and blue self-light-emitting element layer 406, respectively. The hole injection layer, the hole transport layer, the electron transport layer, and the electron injection layer are similar to those in the related art, and hence description thereof is omitted.

The insulating layer 408 includes the plurality of through holes 416, which respectively overlap the plurality of pixel electrodes 404, and is formed to cover a peripheral portion of each of the plurality of pixel electrodes 404. Specifically, for example, as illustrated in FIG. 4A, the insulating layer 408 includes apertures 417 of the plurality of through holes 416 in a surface that is opposite to the self-light-emitting element layers 405 and 406, and is formed in a region that covers the peripheral portion of the pixel electrode 404. Inner surfaces of the through hole 416 are formed to include reversely tapered surfaces 415, which are inclined in a direction of reducing the aperture 417 toward the light emitting direction. The reversely tapered surfaces 415 are formed between the unit pixels 204 (see FIG. 3A) arranged side by side in the second direction 305.

Moreover, as described layer with reference to FIG. 4B, the insulating layer 408 is formed to include forwardly tapered surfaces 418, which are inclined in a direction of enlarging the aperture 417 toward the light emitting direction, between the unit pixels 204 arranged side by side in the first direction 304 illustrated in FIG. 3A. In other words, the insulating layer 408 is formed to have a grating shape including a plurality of first rib portions 420, each of the plurality of first rib portions 420 extending in the second direction 305 illustrated in FIG. 3A, and being arranged at intervals from each other in the first direction 304, and a plurality of second rib portions 419, each of the plurality of second rib portions 419 extending in the first direction 304 to connect the intervals between the first rib portions 420 arranged side by side, and being arranged at intervals from each other in the second direction 305. The reversely tapered surface 415 may be formed in at least a part of a second side surface facing the second direction 305 of each of the second rib portions 419.

Moreover, the insulating layer 408 is configured to have a light shielding property. With the insulating layer 408 having the light shielding property and the reversely tapered surfaces 415 being formed between the unit pixels 204 arranged side by side in the second direction 305, light of different colors emitted by the unit pixels 204 arranged side by side may be prevented from being mixed in the second direction 305.

The common electrode 407 is laminated on the insulating layer 408 and the self-light-emitting element layers 405 and 406. Specifically, as illustrated in FIG. 3B and FIG. 4A, the common electrode 407 is formed to cover the insulating layer 408 and the self-light-emitting element layers 405 and 406. Then, the current is allowed to flow between the common electrode 407 and the pixel electrodes 404 as described above, to thereby cause the self-light-emitting element layers 405 and 406 to emit light.

The light shielding layer 412 is formed at a position corresponding to the second rib portion 419, which is formed in the first direction 304, using a material for shielding light. Specifically, as illustrated in FIG. 4A, the light shielding layer 412 is formed in a region above the second rib portion 419 of the insulating layer 408, which is formed in the array substrate 201, on the upper glass substrate 409 toward the array substrate 201 side. With the effect of preventing the color mixing by the second rib portion 419 to be described below, the width of the light shielding layer 412 may be formed thinner than in the related art, and hence the pixels may have high resolution.

The sealing layer 413 is formed to cover the plurality of pixel electrodes 404, the insulating layer 408, the self-light-emitting element layers 405 and 406, and the common electrode 407. Specifically, as illustrated in FIG. 4A, an interface between the sealing layer 413 and a layer immediately below the sealing layer 413 is formed to have a shape corresponding to the reversely tapered surfaces 415 above the second rib portion 419 of the insulating layer 408.

Next, the sectional structure corresponding to the cross section taken along the line IVb-IVb in FIG. 3B is described with reference to FIG. 4B. Only points different from the cross section taken along the line IVa-IVa are described, and description of similar components, such as the TFT circuit layer 403, is omitted.

As illustrated in FIG. 3B, the insulating layer 408 is formed so that inner surfaces of each of the plurality of through holes 416 include the forwardly tapered surfaces 418, which are inclined in the direction of enlarging the aperture 417 toward the light emitting direction. The forwardly tapered surfaces 418 are formed between the unit pixels 204 arranged side by side in the first direction 304. The forwardly tapered surface 418 may be formed in at least a part of a first side surface facing the first direction 304 of each of the first rib portions 420.

Here, in one through hole 416, on both ends along the first direction 304, two forwardly tapered surfaces 418 of the first rib portions 420 of the insulating layer 408, which are arranged in the second direction 305, are formed. Each of those forwardly tapered surfaces 418 serves, together with the forwardly tapered surface 418 of the through hole 416 that is adjacent in the first direction 304 via the first rib portion 420 of the insulating layer 408, as a side surface of the insulating layer 408 formed at the boundary of the through holes 416.

Moreover, with both sides of the insulating layer 408 being formed to include the forwardly tapered surfaces 418 in the cross section taken along the line IVb-IVb, the self-light-emitting element layers 405 and 406 are formed to cover the insulating layer 408.

Next, the sectional structure corresponding to the cross section taken along the line IVc-IVc in FIG. 3B, and the sectional structure corresponding to the cross section taken along the line IVd-IVd are described with reference to FIG. 4C and FIG. 4D. In the cross section taken along the line IVc-IVc and the cross section taken along the line IVd-IVd, as illustrated in FIG. 4C and FIG. 4D, only wiring for supplying a voltage to the pixel transistors 414 is formed in the TFT circuit layer 403. However, the pixel transistors 414 may be formed across the cross section taken along the line IVa-IVa and the cross section taken along the line IVc-IVc.

The first rib portion 420 of the insulating layer 408 in the cross section taken along the line IVc-IVc is formed similarly to the first rib portion 420 in the cross section IVb-IVb. The second rib portion 419 is formed to extend in the first direction 304, but in a region in which the first rib portion 420 is formed, the second rib portion 419 is formed to have a slight step that is thinner than the thickness of the common electrode 407 on the first rib portion 420, or formed to be flush with the first rib portion 420. This structure is obtained by forming the first rib portion 420, and then forming the second rib portion with a photolithography method.

The upper surface of the second rib portion 419 may be formed lower than the upper surface of the first rib portion 420 in sectional view. Specifically, for example, the second rib portion 419 of the insulating layer 408 in the cross section taken along the line IVc-IVc may be formed lower than the first rib portion 420, and formed intermittently via a portion of the first rib portion 420. This structure is obtained by forming the first rib portion 420, and then forming the second rib portion 419 by an ink jet method. With this structure, the common electrode becomes less likely to be disconnected than with the above-mentioned structure.

Moreover, the first rib portion 420 of the insulating layer 408 in the cross section taken along the line IVd-IVd is formed at a uniform height in the second direction 305. Then, the second rib portion 419 of the insulating layer 408 in the cross section taken along the line IVd-IVd is formed on the first rib portion 420 to extend continuously in the first direction 304, and to have the reversely tapered surfaces 415 also on the first rib portion 420. As in the above description, the second rib portion 419 and the first rib portion 420 may be connected without a step to be flush with each other.

As described above, according to this embodiment, the forwardly tapered surfaces 418 are formed between the adjacent unit pixels 204 that emit light of the same color, and the reversely tapered surfaces 415 are formed between the adjacent unit pixels 204 that emit light of different colors, that is, between the unit pixels 204 arranged side by side in the second direction 305. Therefore, the unit pixels 204 of the same color may be formed side by side in the first direction 304 to prevent a state in which light of different colors is mixed, and the reversely tapered surfaces 415 may be formed in the second direction 305 to prevent the state in which light of different colors is mixed. Further, the forwardly tapered surface 418 may be formed in at least a part of the aperture 417 of the insulating layer 408 to prevent the cathode electrode from being disconnected.

Figure 5A:
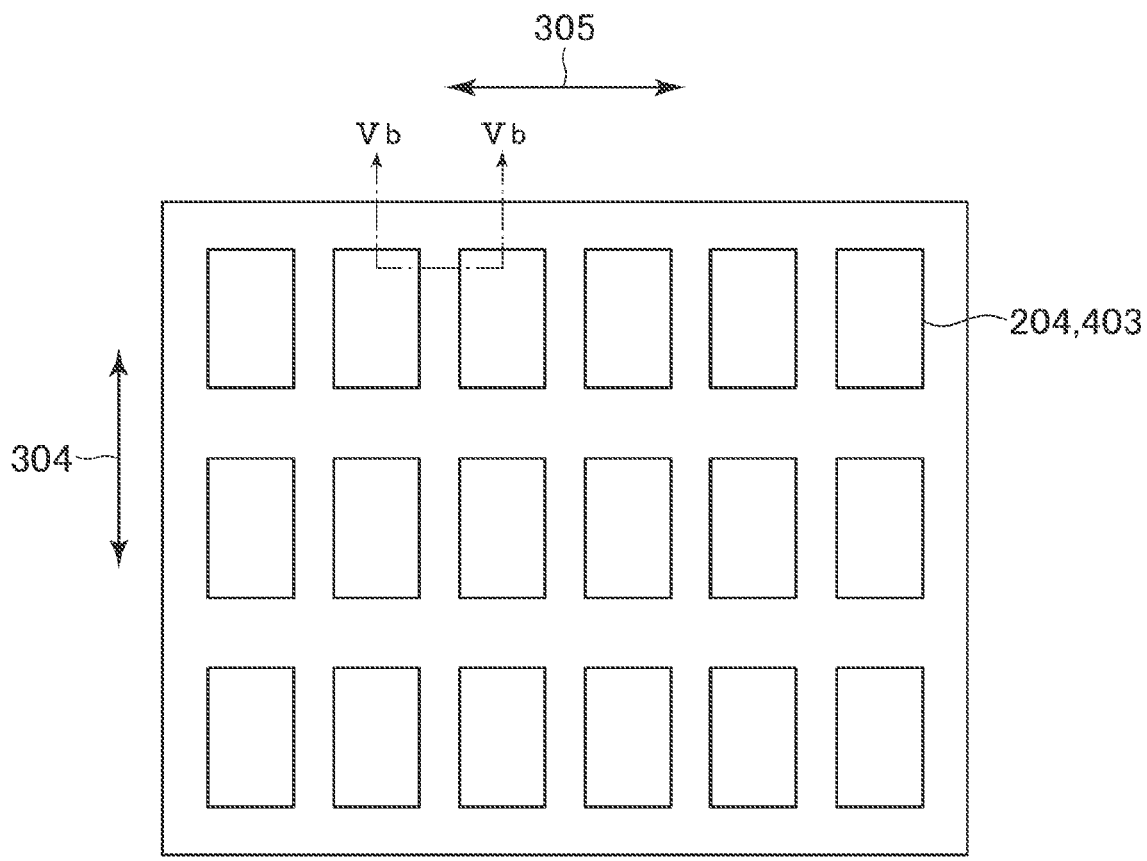
FIG. 5A and FIG. 5B are a plan view and a sectional view taken along the line Vb-Vb for illustrating a step of forming pixel electrodes, respectively.
Figure 5B:
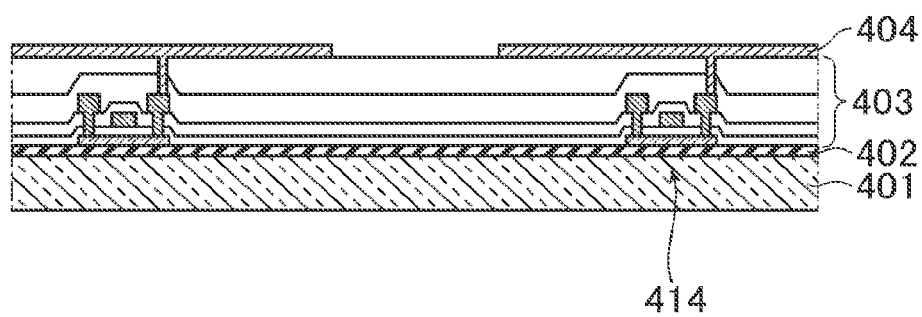

Next, a method of manufacturing the display device 100, which includes the plurality of unit pixels 204 as described above with reference to FIG. 3A to FIG. 4D to display a color image, is described with reference to FIG. 5A to FIG. 12D. First, as illustrated in FIG. 5A and FIG. 5B, the inorganic insulating layer 402 is formed on the lower glass substrate 401, and the pixel transistors 414 and the pixel electrodes 404 respectively corresponding to the unit pixels 204 are formed above the inorganic insulating layer 402. Here, the plurality of unit pixels 204 are arranged so that the unit pixels 204 of the same color are arranged in the first direction 304, and so that the unit pixels 204 of different colors are arranged side by side in the second direction 305, which crosses the first direction 304 (see FIG. 3A). This step is similar to that in the related art, and hence detailed description thereof is omitted.

Next, the insulating layer 408 having the grating shape including the plurality of through holes 416, which respectively overlap the plurality of pixel electrodes 404 respectively corresponding to the plurality of unit pixels 204, is formed to cover the peripheral portion of each of the plurality of pixel electrodes 404 (see FIG. 3B). In this step, the insulating layer 408 includes the apertures 417 of the plurality of through holes 416 in the surface that is opposite to the self-light-emitting element layers, and the inner surfaces of each of the through holes 416 are formed to include the forwardly tapered surfaces 418, which are inclined in the direction of enlarging the aperture 417 toward the light emitting direction, and the reversely tapered surfaces 415, which are inclined in the direction of reducing the aperture 417 toward the light emitting direction.

Figure 6A:
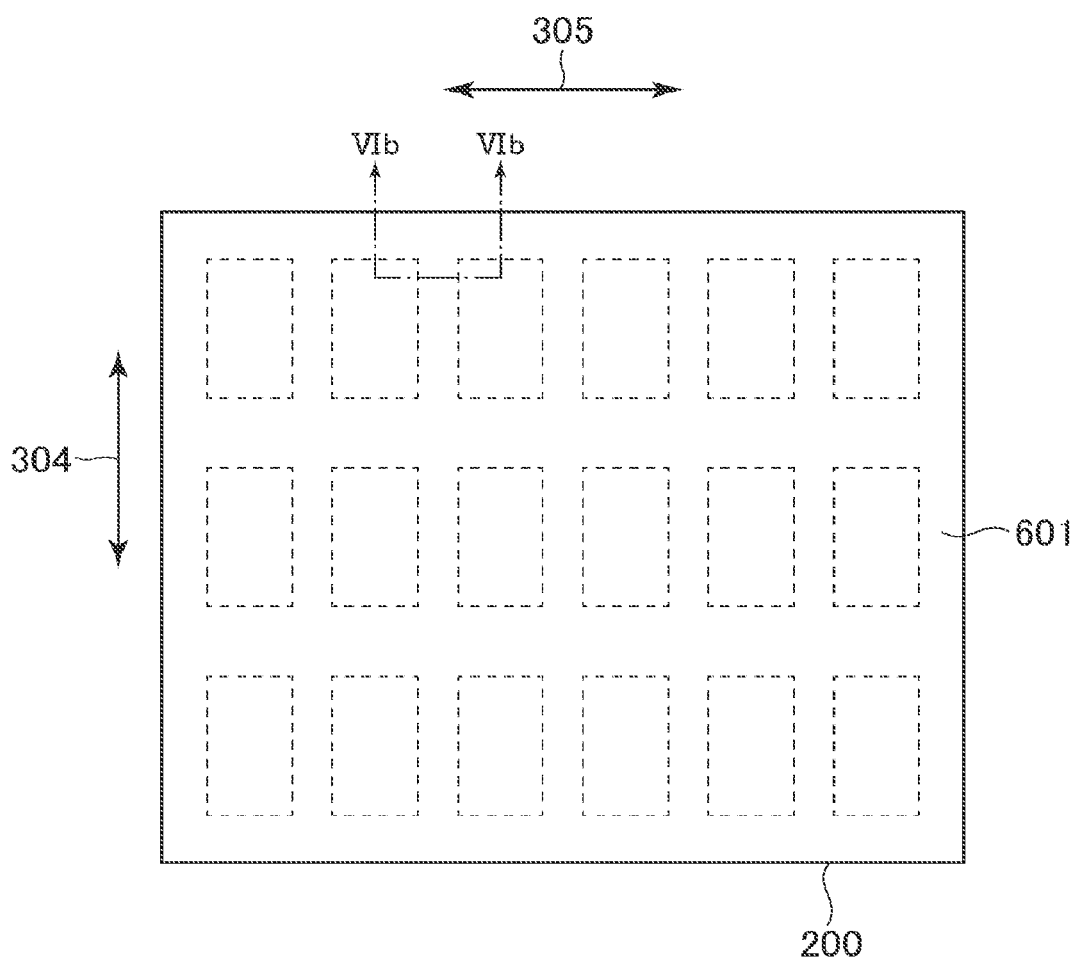
FIG. 6A and FIG. 6B are a plan view and a sectional view taken along the line VIb-VIb for illustrating a step of forming a first rib portion, respectively.
Figure 6B:
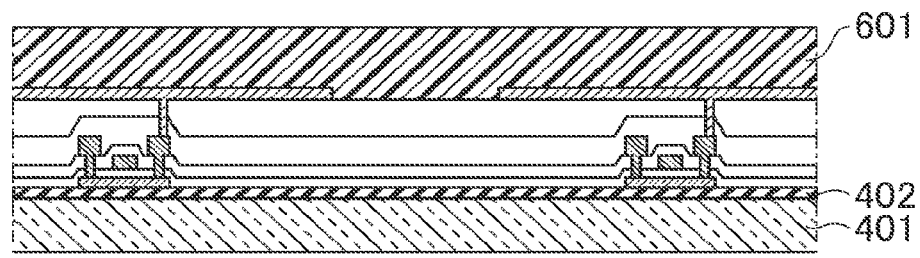

Specifically, first, as illustrated in FIG. 6A and FIG. 6B, a first photosensitive resin layer 601 of a negative type, which has solubility that is reduced in developer by exposure to light. Here, the first photosensitive resin layer 601 is applied to the entire surface of the organic EL panel 200. As described above, when the second rib portion 419 of the insulating layer 408 is to be formed intermittently, the first rib portion 420 may be formed by the ink jet method.

Next, the first photosensitive resin layer 601 is patterned to form the plurality of first rib portions 420, each of the plurality of first rib portions 420 extending in the second direction 305, and being arranged side by side in the first direction 304 among the unit pixels 204, to have the forwardly tapered surface 418 in at least a part of the first side surface facing the first direction 304 (see FIG. 3B).

Figure 7A:
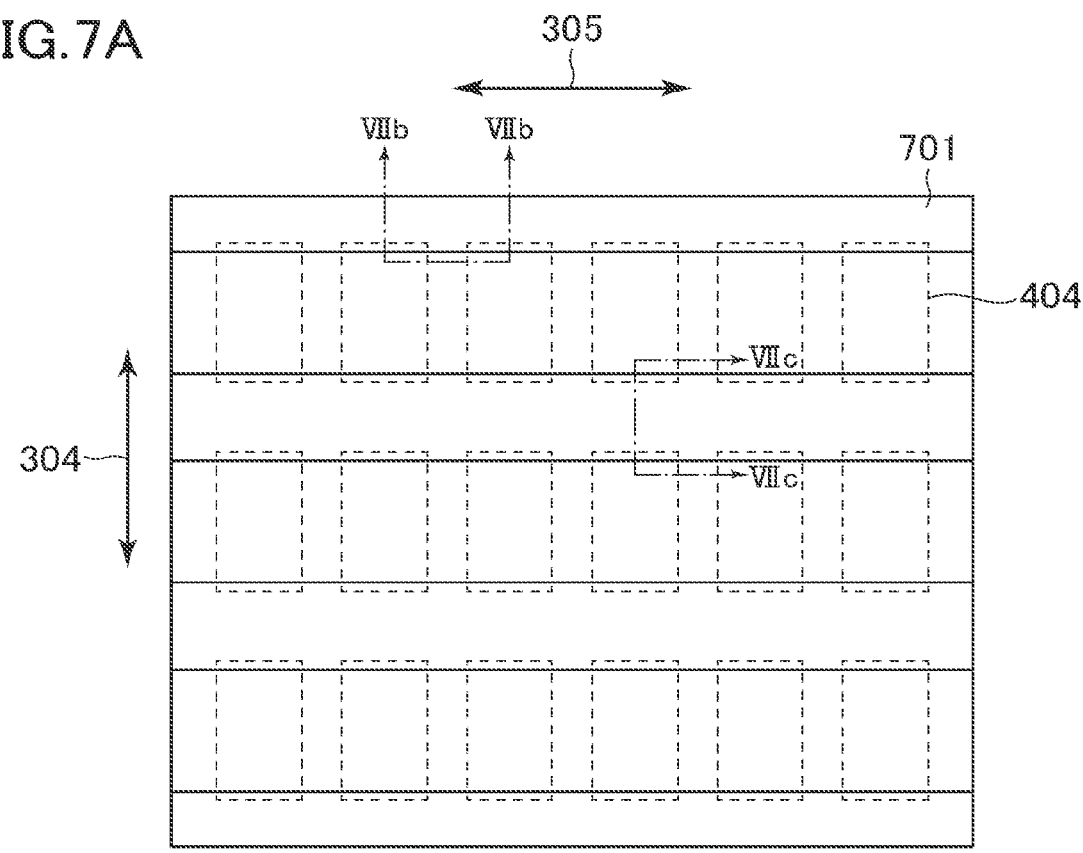
FIG. 7A to FIG. 7C are a plan view, a sectional view taken along the line VIIb-VIIb, and a sectional view taken along the line VIIc-VIIc for illustrating a step of forming the first rib portion, respectively.
Figure 7B:
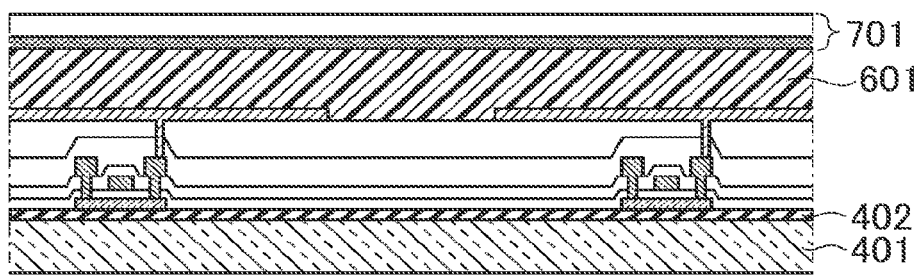

Specifically, as illustrated in FIG. 7A, a photomask 701, in which a pattern for shielding light along the second direction 305 is formed, is placed on the organic EL panel 200 to cover the regions in which the pixel electrodes 404 are formed. Here, as illustrated in FIG. 7B, the first photosensitive resin layer 601 is entirely covered by the mask pattern in the cross section taken along the line VIIb-VIIb. Moreover, as illustrated in FIG. 7C, regions excluding the region in which the first rib portion 420 is formed of the first photosensitive resin layer 601 is covered by the mask pattern in the cross section taken along the line VIIc-VIIc.

Figure 7C:
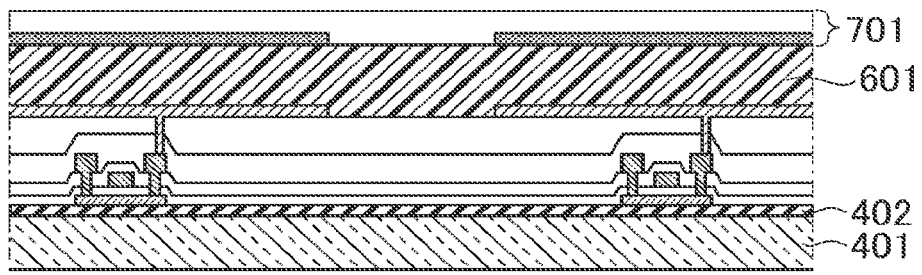

Next, by being exposed to light in the state in which the photomask 701 is placed as in FIG. 7A to FIG. 7C, the first photosensitive resin layer 601 formed in the exposed regions are reduced in solubility in developer.

Figure 8A:
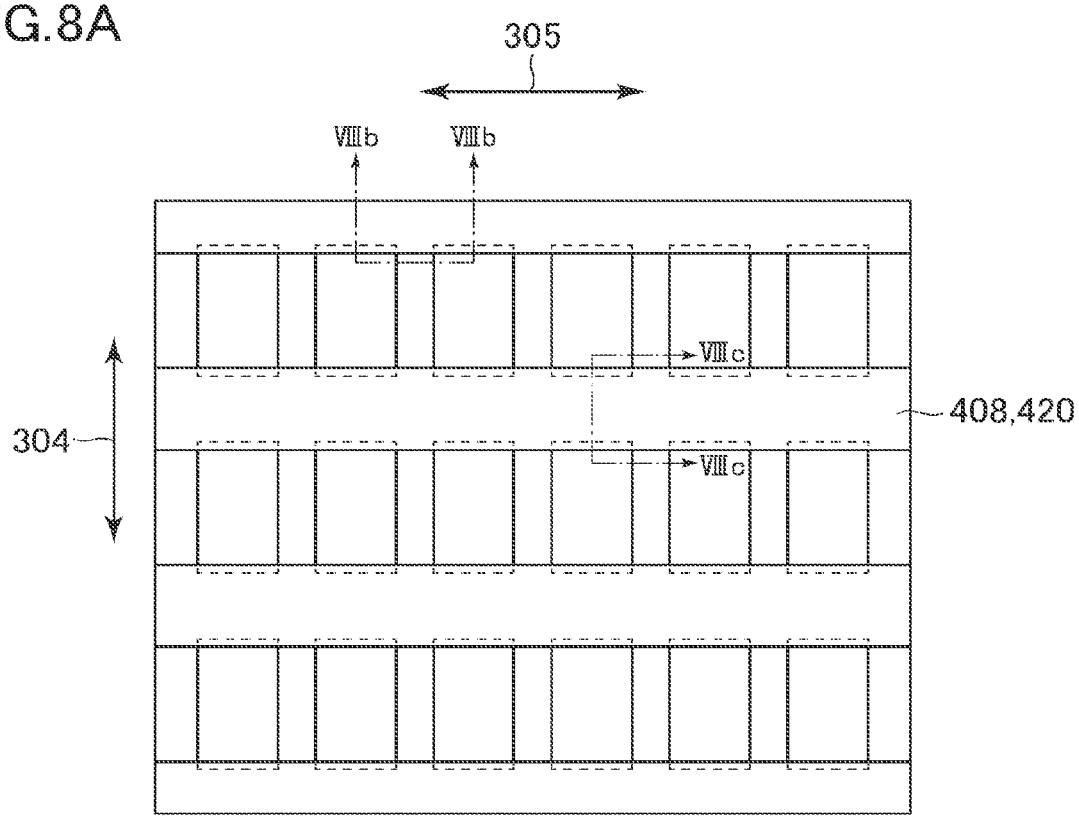
FIG. 8A to FIG. 8C are a plan view, a sectional view taken along the line VIIIb-VIIIb, and a sectional view taken along the line VIIIc-VIIIc for illustrating a step of forming the first rib portion, respectively.
Figure 8B:
Figure 8C:
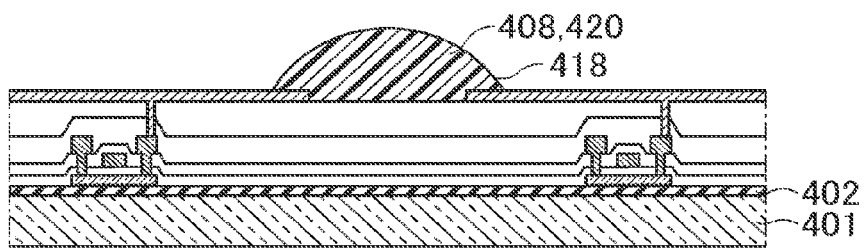

Then, by being developed, as illustrated in FIG. 8A and FIG. 8C, the first photosensitive resin layer 601 formed in regions that have not been exposed to light is dissolved to form the first rib portions 420. Here, as described above, a material of the negative type is used for the first photosensitive resin layer 601, and hence the side surfaces of the first rib portion 420 are formed to include the forwardly tapered surfaces 418.

Next, in steps illustrated in FIG. 9A to FIG. 12D, a second photosensitive resin layer 901 is patterned to form the plurality of second rib portions 419, each of the plurality of second rib portions 419 extending in the first direction 304 to connect the intervals between the first rib portions 420 arranged side by side, and being arranged among the unit pixels 204 arranged side by side in the second direction 305, so that the reversely tapered surface 415 is formed in at least a part of the second side surface facing the second direction 305. In order to form the upper surface of the second rib portion 419 lower than the upper surface of the first rib portion 420, the second photosensitive resin layer 901 may be formed by being applied by the ink jet method, for example.

Figure 9A:
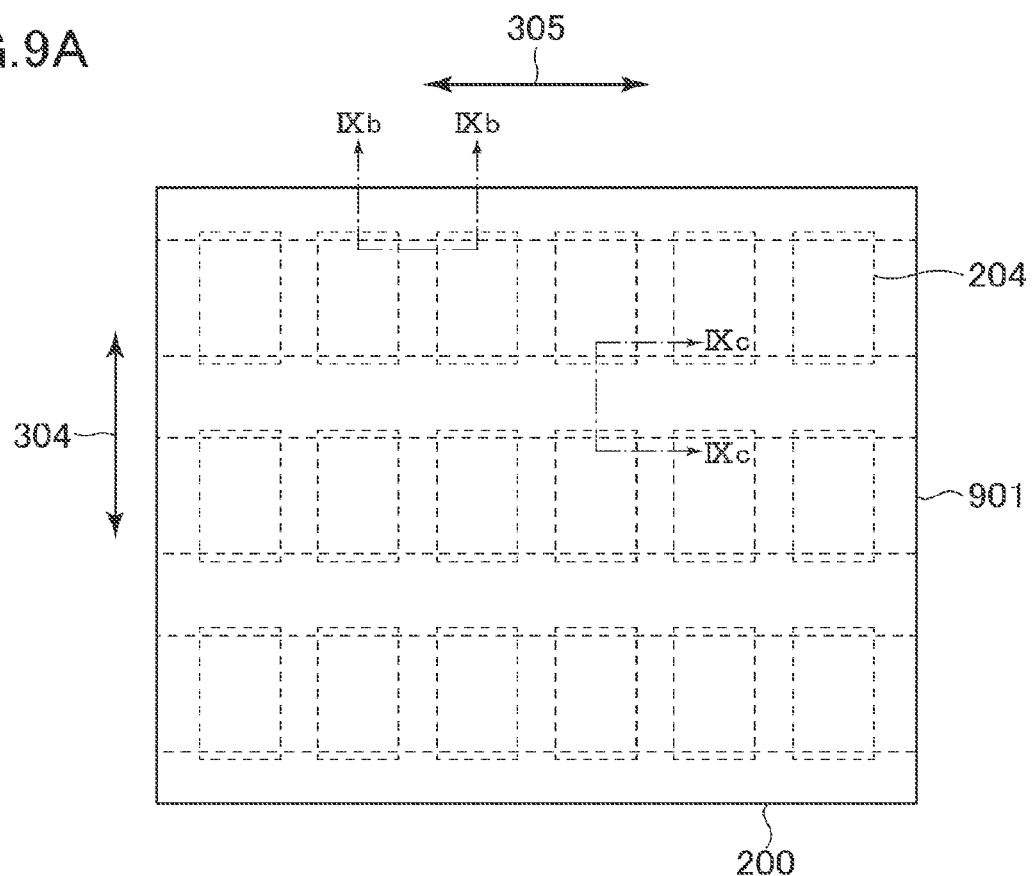
FIG. 9A to FIG. 9C are a plan view, a sectional view taken along the line IXb-IXb, and a sectional view taken along the line IXc-IXc for illustrating a step of forming a second rib portion, respectively.
Figure 9B:
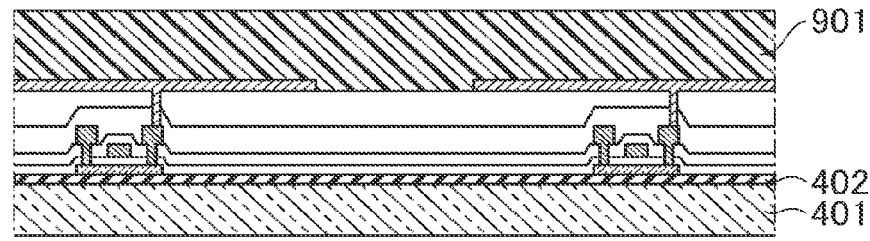
Figure 9C:
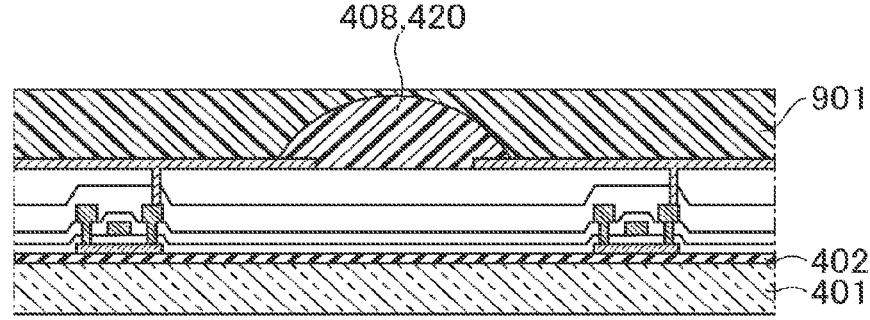

Specifically, first, as illustrated in FIG. 9A to FIG. 9C, the first photosensitive resin layer 601 is patterned, and then a second photosensitive resin layer 901 of a positive type, which has solubility that is increased in developer by exposure to light. Here, the second photosensitive resin layer 901 is applied to the entire surface of the organic EL panel 200.

Figure 10A:
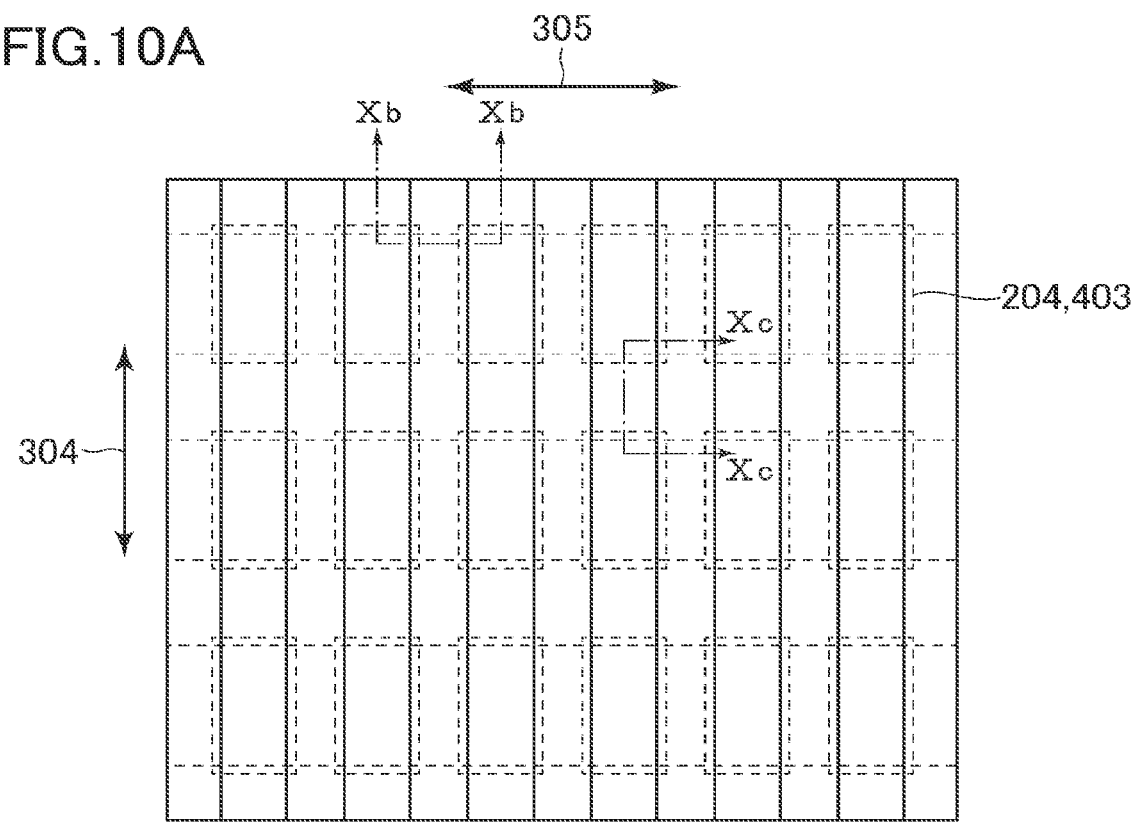
FIG. 10A to FIG. 10C are a plan view, a sectional view taken along the line Xb-Xb, and a sectional view taken along the line Xc-Xc for illustrating a step of forming the second rib portion, respectively.
Figure 10B:
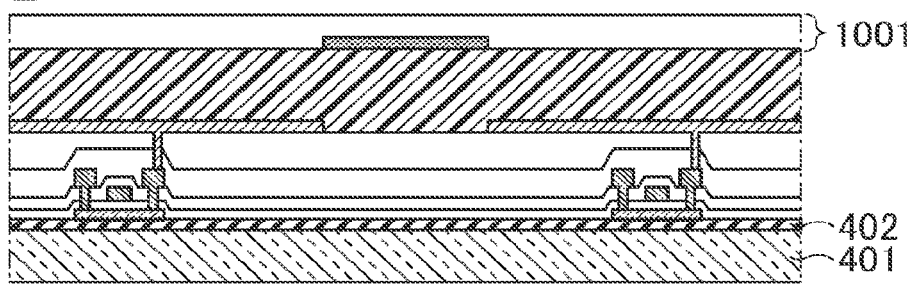
Figure 10C:
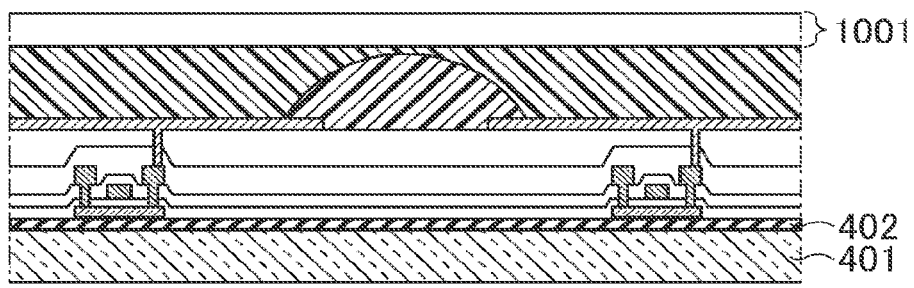

Next, as illustrated in FIG. 10A to FIG. 10C, a photomask 1001, in which a pattern for shielding light along the first direction 304 is formed, is placed on the organic EL panel 200 to cover the regions among the adjacent pixel electrodes 404. Here, as illustrated in FIG. 10B, the region in which the first rib portion 420 is formed is covered by the mask pattern in the cross section taken along the line Xb-Xb. Moreover, as illustrated in FIG. 10C, the pattern for shielding light is not formed in the photo mask 1001 in the cross section taken along the line Xc-Xc.

Next, by being exposed to light in the state in which the photomask 1001 is placed as in FIG. 10A to FIG. 10C, the second photosensitive resin layer 901 formed in the exposed regions are increased in solubility in developer.

Figure 11A:
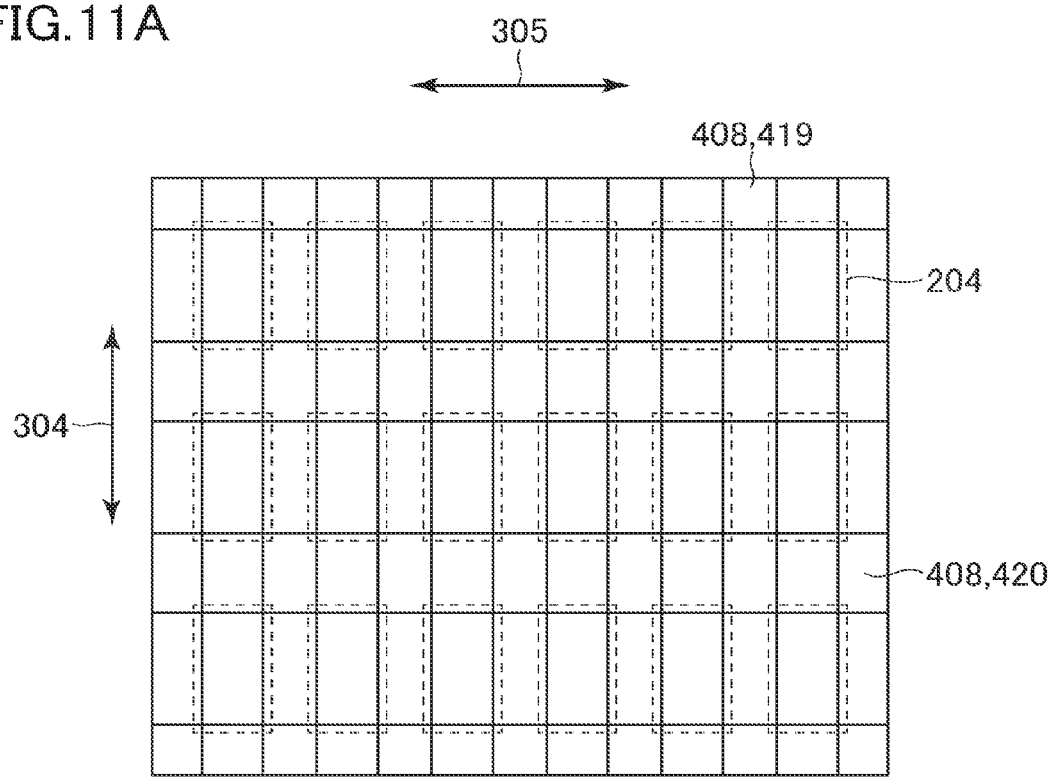
FIG. 11A and FIG. 11B are a plan view and a perspective view for illustrating a step of forming the second rib portion, respectively.
Figure 11B:
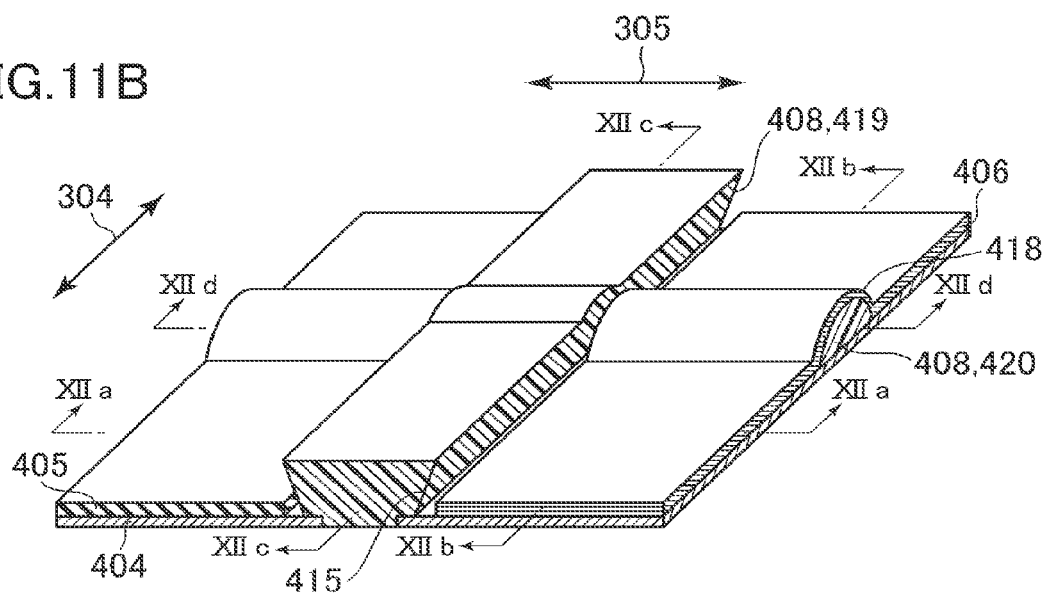

Then, by being developed, as in FIG. 11A and FIG. 11B, the second photosensitive resin layer 901 formed in the exposed regions is dissolved to form the second rib portions 419. As described above, a material of the positive type is used for the second photosensitive resin layer 901, and hence the side surfaces of the second rib portion 419 are formed to include the reversely tapered surfaces 415.

As with FIG. 3B, FIG. 11B is a perspective view around four unit pixels 204 in FIG. 11A. As with FIG. 3B, FIG. 11B is a view for schematically illustrating the organic EL panel 200, and parts of the TFT circuit layer and the like are omitted. Moreover, FIG. 12A to FIG. 12D are sectional views of portions corresponding to four cross sections taken along the lines XIIa-XIIa to XIId-XIId illustrated in FIG. 11B, respectively.

Figure 12A:
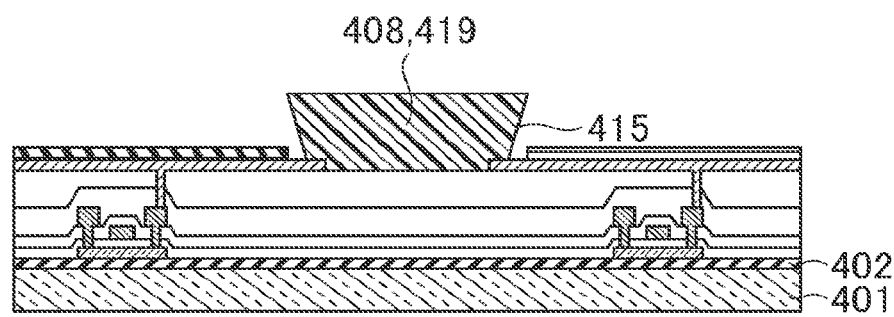
FIG. 12A, FIG. 12B, FIG. 12C, and FIG. 12D are sectional views corresponding to cross sections taken along the lines XIIa-XIIa to XIId-XIId in FIG. 11B, respectively.
Figure 12B:
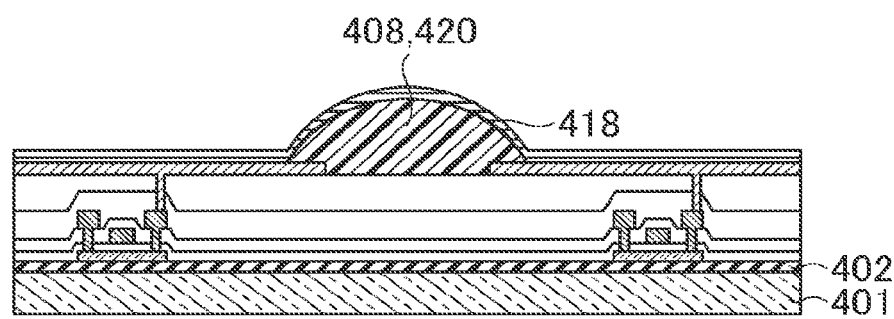
Figure 12C:
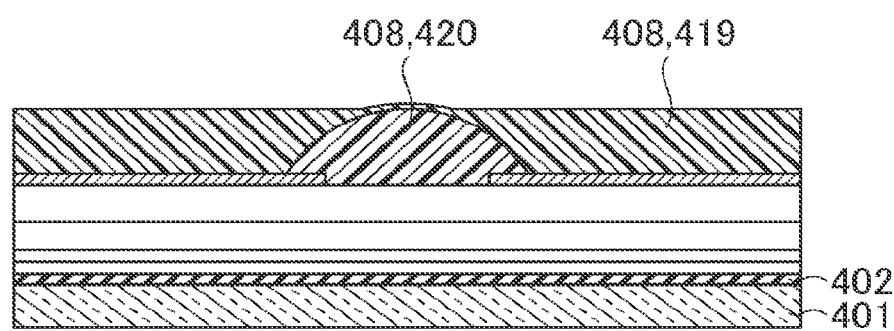
Figure 12D:
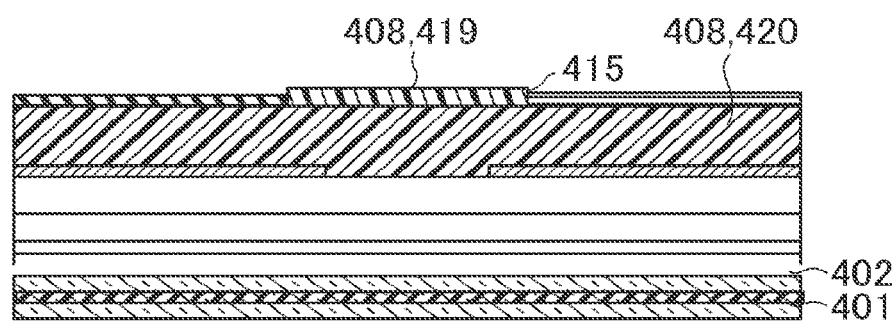

As illustrated in FIG. 12A, the insulating layer 408 in the cross section taken along the line XIIa-XIIa is formed to include the reversely tapered surfaces 415 between the unit pixels 204 arranged side by side in the second direction 305. Moreover, as illustrated in FIG. 12B, the insulating layer 408 in the cross section taken along the line XIIb-XIIb is formed to include the forwardly tapered surfaces 418 between the unit pixels 204 arranged side by side in the first direction 304. Then, as illustrated in FIG. 12C, the insulating layer 408 in the cross section taken along the line XIIc-XIIc is formed to extend in the first direction 304 with the plurality of second rib portions 419. Further, as illustrated in FIG. 12D, the insulating layer 408 in the cross section taken along the line XIId-XIId is formed so that the second rib portion 419 extends continuously in the first direction 304 on the first rib portion 420, and has the reversely tapered surfaces 415 also on the first rib portion 420. In the steps illustrated in FIG. 6A to FIG. 12D, the insulating layer 408 is formed to have the grating shape as described above.

Subsequently, the self-light-emitting element layers 405 and 406 are formed to be laminated on the insulating layer 408, to be connected to the plurality of pixel electrodes 404 via the plurality of through holes 416, and to emit light by being controlled in brightness by currents. Then, the common electrode 407 is formed to be laminated on the insulating layer 408 and the self-light-emitting element layers 405 and 406, and to allow the currents to flow through the self-light-emitting element layers 405 and 406 together with the plurality of pixel electrodes 404. Further, the opposing substrate 202, in which the color filter layers 410 and 411 and the light shielding layer 412 are formed, and the array substrate 201 are bonded by the sealing layer 413 to complete the organic EL panel 200 illustrated in FIG. 3A to FIG. 4D.

The present invention is not limited to the above-mentioned embodiment, and may include various modifications. Specifically, in the embodiment described above, the case where the above-mentioned organic EL panel 200 includes the unit pixels 204 of three colors, which emit red light, green light, and blue light, has been described, for example, but the present invention is not limited thereto. For example, four unit pixels 204, in which self-light-emitting elements configured to emit light of four colors: red, green, blue, and white are arranged, may form one pixel. Moreover, the number of unit pixels 204 forming one pixel may be four or more.

Figure 13A:
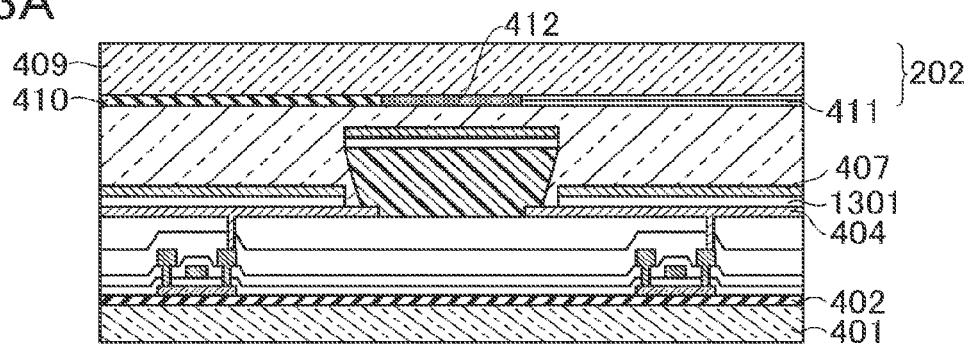
FIG. 13A, FIG. 13B, FIG. 13C, and FIG. 13D are views for illustrating another embodiment of the present invention.
Figure 13B:
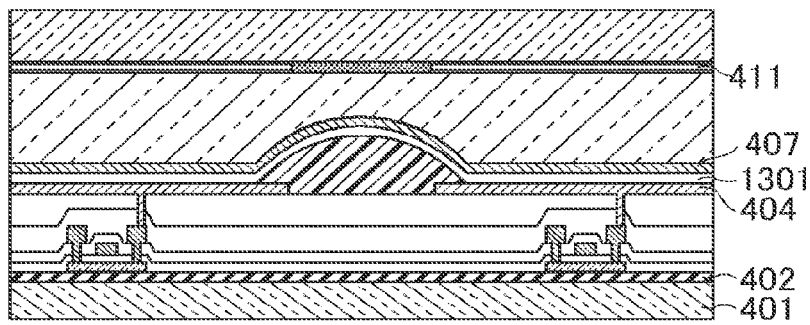
Figure 13C:
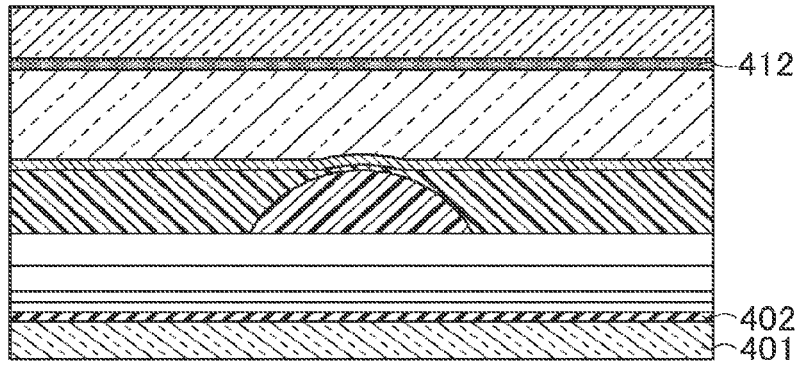
Figure 13D:
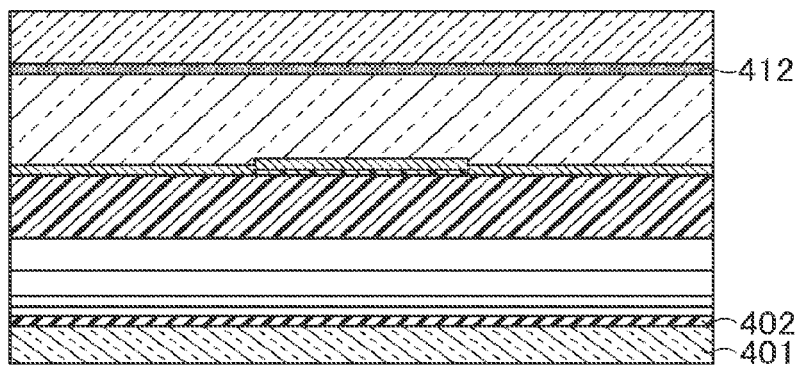
Figure 14:
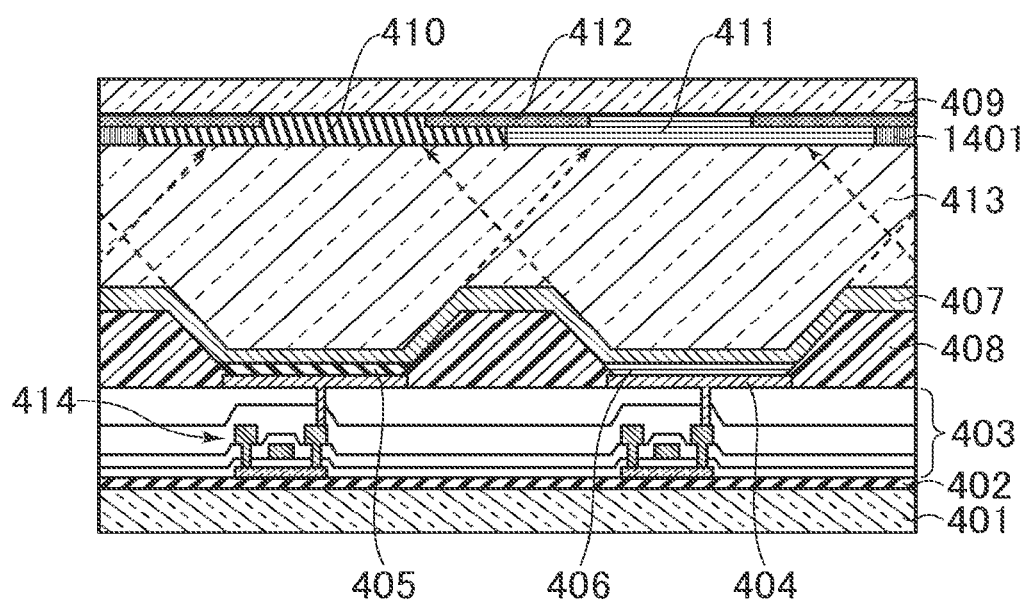
FIG. 14 is a view for illustrating color mixing of light that occurs in the related art.

The sectional views of FIG. 13A to FIG. 13D in this modified embodiment are views corresponding to FIG. 4A to FIG. 4D in the above-mentioned embodiment. As illustrated in FIG. 13A and FIG. 13B, as the self-light-emitting element layer, a white self-light-emitting element layer 1301 may be formed to emit white light in all of the unit pixels 204. In this case, as a material used for the light emitting layer, an organic EL material that emits white light is used. Moreover, the white self-light-emitting element layer 1301 may be formed to cover an upper portion of the insulating layer 408.

The Color filter layers 410 and 411 are formed in the opposing substrate 202 to produce color display. The color filter layers 410 and 411 have colored regions of a plurality of colors above the pixel electrodes 404. Specifically, for example, the color filter layers 410 and 411 include, among the light shielding layer 412 formed on the upper glass substrate 409, a red color filter layer (not shown) configured to selectively transmit red light, a green color filter layer 410 configured to selectively transmit green light, and a blue color filter layer 411 configured to selectively transmit blue light. The color filter layers are configured to selectively transmit light of particular colors of light emitted from the self-light-emitting element layer 1301 so that the organic EL panel 200 produces color display.

More specifically, in the sectional view of FIG. 13A, the color filter layers are formed to include the green color filter layer 410 in the unit pixel 204 on the left, and to include the blue color filter layer 411 in the unit pixel 204 on the right. Moreover, in the sectional view of FIG. 13B, the color filter layers are formed to include the blue color filter layer 411 in each of the two unit pixels 204 arranged side by side on the left and right. Further, in the sectional views of FIG. 13C and FIG. 13D, the color filters are formed to include the light shielding layer 412.

As a result, as with the case where the self-light-emitting element layers are formed of light emitting layers configured to emit light of the plurality of colors, the display device 100 produces color display. The self-light-emitting element layer may be configured to emit light of a single color to reduce the load during manufacturing.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, which includes a plurality of unit pixels of a plurality of colors, and is configured to display a color image, comprising:
    a plurality of first electrodes respectively corresponding to the plurality of unit pixels;
    an insulating layer, which includes a plurality of through holes respectively overlapping the plurality of first electrodes, and is configured to cover peripheral portions of each of the plurality of first electrodes:
    a light emitting element layer, which is laminated on the insulating layer, and is connected to the plurality of first electrodes via the plurality of through holes; and
    a second electrode, which is laminated on the insulating layer and the light emitting element layer,
    the plurality of unit pixels being arranged so that the unit pixels of the same color are arranged in a first direction and the unit pixels of different colors are arranged side by side in a second direction, which crosses the first direction,
    the insulating layer including apertures of the plurality of through holes in a surface that is opposite to the light emitting element layer,
    each of the plurality of through holes having inner surfaces including a forwardly tapered surface, which is inclined in a direction of enlarging the apertures toward a light emitting direction, and a reversely tapered surface, which is inclined in a direction of reducing the apertures toward the light emitting direction,
    the forwardly tapered surface being formed between the unit pixels arranged side by side in the first direction,
    the reversely tapered surface being formed between the unit pixels arranged side by side in the second direction,
    wherein the insulating layer has a grating shape including a plurality of first rib portions, each of the plurality of first rib portions extending in the second direction, and being arranged at intervals from each other in the first direction, and a plurality of second rib portions, each of the plurality of second rib portions extending in the first direction to connect the intervals between the first rib portions arranged side by side, and being arranged at intervals from each other in the second direction,
    wherein the forwardly tapered surface comprises at least a part of a first side surface facing the first direction of each of the plurality of first rib portions, and
    wherein the reversely tapered surface comprises at least a part of a second side surface facing the second direction of each of the plurality of second rib portions.

2. The display device according to claim 1, further comprising a color filter layer including a plurality of colored regions of a plurality of colors respectively corresponding to the plurality of unit pixels.

3. The display device according to claim 2, wherein the light emitting element layer is configured to emit light of a single color toward the plurality of colored regions.

4. The display device according to claim 1, wherein the insulating layer is configured to have a light shielding property.

5. The display device according to claim 1, wherein the plurality of second rib portions have an upper surface that is formed higher than an upper surface of the plurality of first rib portions in sectional view, and have a difference in height between the plurality of first rib portions and the plurality of second rib portions of equal to or less than a thickness of the second electrode.

6. The display device according to claim 5, wherein the plurality of second rib portions and the plurality of first rib portions are connected without a step to be flush with each other.

7. The display device according to claim 1, wherein the plurality of second rib portions have an upper surface that is formed lower than an upper surface of the plurality of first rib portions in sectional view.

8. The display device according to claim 1, further comprising a sealing layer, which is configured to cover the plurality of first electrodes, the insulating layer, the light emitting element layer, and the second electrode,
    wherein an interface between the sealing layer and a layer immediately below the sealing layer has a shape corresponding to the reversely tapered surface above the plurality of first rib portions.

9. A method of manufacturing a display device, which includes a plurality of unit pixels of a plurality of colors, and is configured to display a color image, the method comprising:
    forming an insulating layer, which has a grating shape including a plurality of through holes respectively overlapping a plurality of first electrodes respectively corresponding to the plurality of unit pixels, and is configured to cover peripheral portions of each of the plurality of first electrodes;
    forming a light emitting element layer, which is laminated on the insulating layer, and is connected to the plurality of first electrodes via the plurality of through holes; and
    forming a second electrode, which is laminated on the insulating layer and the light emitting element layer,
    the plurality of unit pixels being arranged so that the unit pixels of the same color are arranged in a first direction and the unit pixels of different colors are arranged side by side in a second direction, which crosses the first direction,
    the insulating layer including apertures of the plurality of through holes in a surface that is opposite to the light emitting element layer,
    each of the plurality of through holes having inner surfaces including a forwardly tapered surface, which is inclined in a direction of enlarging the apertures, and a reversely tapered surface, which is inclined in a direction of reducing the apertures,
    the forming an insulating layer comprising:
        forming a first photosensitive resin layer of a negative type, which has solubility that is reduced in developer by exposure to light;
        patterning the first photosensitive resin layer to form a plurality of first rib portions, each of the plurality of first rib portions extending in the second direction, and being arranged side by side in the first direction among the unit pixels, to have the forwardly tapered surface in at least a part of a first side surface facing the first direction;

forming, after patterning the first photosensitive resin layer, a second photosensitive resin layer of a positive type, which has solubility that is increased in developer by exposure to light; and patterning the second photosensitive resin layer to form a plurality of second rib portions, each of the plurality of second rib portions extending in the first direction to connect intervals between the first rib portions that are arranged side by side, and being arranged among the unit pixels that are arranged side by side in the second direction, to have the reversely tapered surface in at least a part of a second side surface facing the second direction.

* * * * *